United States Patent
Hu et al.

(10) Patent No.: US 8,379,788 B2
(45) Date of Patent: Feb. 19, 2013

(54) SYSTEMS AND METHODS FOR PERFORMING PARALLEL DIGITAL PHASE-LOCKED-LOOP

(75) Inventors: Junquiang Hu, Davis, CA (US); Tyrone Kwok, Cupertino, CA (US); Ting Wang, Cupertino, CA (US)

(73) Assignee: NEC Laboratories America, Inc., Princeton, NJ (US)

( * ) Notice: Subject to any disclaimer, the term of this patent is extended or adjusted under 35 U.S.C. 154(b) by 312 days.

(21) Appl. No.: 12/818,158

(22) Filed: Jun. 18, 2010

(65) Prior Publication Data

US 2011/0310998 A1    Dec. 22, 2011

(51) Int. Cl.
*H03D 3/24*    (2006.01)
(52) U.S. Cl. ......................................... 375/376; 327/156
(58) Field of Classification Search .................. 327/156; 375/316, 376
See application file for complete search history.

(56) References Cited

U.S. PATENT DOCUMENTS

| 5,400,364 | A | * | 3/1995 | Yada ............................ 375/327 |
| 6,112,308 | A | * | 8/2000 | Self et al. ..................... 713/400 |
| 6,118,316 | A | * | 9/2000 | Tamamura et al. ........... 327/156 |
| 2003/0165209 | A1 | * | 9/2003 | Chen et al. .................... 375/376 |
| 2004/0155685 | A1 | * | 8/2004 | Tatem, Jr. ..................... 327/156 |

OTHER PUBLICATIONS

N. Seguin, Analysis of a decision-directed phase-locked loop for binary partial response continuous phase modulation with index 0.5. Vehicular Technology Conference, 1991. Gateway to the Future Technology in Motion., 41st IEEE.
D. P. Taylor, A Decision-Directed Carrier Recovery Loop for Duobinary Encoded Offset QPsK Signals. IEEE Transactions on Communications, vol. Com-27, No. 2, Feb. 1979.

* cited by examiner

*Primary Examiner* — Leon-Viet Nguyen
(74) *Attorney, Agent, or Firm* — Joseph Kolodka; Bao Tran

(57) ABSTRACT

A parallel phase locked loop (PLL) system includes a first chain of a plurality of pre-locking PLLs that operates from a free-run state to a locked state; and a second chain of a plurality of PLLs to work from the locked-state to recover signal output.

12 Claims, 8 Drawing Sheets

US 8,379,788 B2

SYSTEMS AND METHODS FOR PERFORMING PARALLEL DIGITAL PHASE-LOCKED-LOOP

BACKGROUND

This application relates to a parallel phase locked loop.

In digital signal processing (DSP), a phase-locked-loop (PLL) is commonly used to compensate phase jitter and frequency offset in phase-modulated digital receiver systems, including wireless receivers that use local oscillators to convert a radio frequency (RF) signal to a base-band signal, and optical coherent receivers that use local lasers to facilitate optical signal detection. Due to frequency offset and phase jitter generated at the local oscillator or laser, the received signal often has dynamic phase rotations which must be compensated to recover the original signal. A PLL can track the phase change and frequency difference between the local oscillator/laser and the transmitter, and rotate the phase of received signal to the correct position.

Conventional implementations of PLL require continuous error calculation and tracking of the received signal. Such an approach can be problematic in high-speed applications, such as 10 Gb/s or higher rate digital receivers, because segment-by-segment or parallel processing is needed. However, the inclusion of multiple parallel PLL units can result in sequential inputs to a single PLL unit being discontinuous.

SUMMARY

In one aspect, a parallel phase locked loop (PLL) system includes a first chain of a plurality of pre-locking PLLs that operates from a free-run state to a locked state; and a second chain of a plurality of PLLs to work from the locked-state to recover signal output.

Implementations of the above system may include one or more of the following. The two chains can contain multiple PLLs. Each PLL inside one chain passes internal states to a subsequent PLL after processing of one segment. Each of the first and second chains has matching number of PLLs, or can have differing number of PLLs. The PLLs can operate in parallel, wherein after processing of one segment in a particular block, each PLL immediately processes another segment in a subsequent next block. The first and second chains can process different number of samples in one block or can process the same number of samples in one block. The PLL can be a decision directed PLL (DDPLL). The DDPLL can have an internal state with a frequency offset. The first chain can have a frequency offset initialized to a previous processing value. The internal state of one DDPLL can be passed to a subsequent DDPLL. The internal state can be a voltage controlled oscillator (VCO) output for a phase rotation. The VCO can compensate a phase output using a subtractor, wherein the subtractor output is coupled to a decision block and an error calculation block to determine an error, wherein the error is processed by a low-pass-filter to get a frequency offset, and the frequency offset together with adjusted error are added as a VCO updating value. The first chain can be initialized to a predetermined value.

In another aspect, a receiver includes a local oscillator inducing a frequency offset and a phase jitter on an initial signal; and a digital signal processor coupled to the local oscillator to rotate a phase to recover the initial signal, the digital signal processing including a parallel phase locked loop (PLL).

Advantages of the preferred embodiments may include one or more of the following. The system enables the application of PLL in high-speed, segment-by-segment parallel processing system. The two-chain processing architecture (pre-locking chain to have PLL locked; regular processing chain to generate signals output from PLL locked state) supports high performance. The initial phase decision for the regular processing chain's outputs from each block is flexible: initial phase has pre-defined value; or the initial phase can have a differential encoding/decoding value. For each PLL, after finished the processing of one segment in a particular block, it may start the processing of another segment in the next block. This gives no wasting time in each PLL module and thus enables parallel processing, for high processing throughput

DESCRIPTION

Figure 1A:
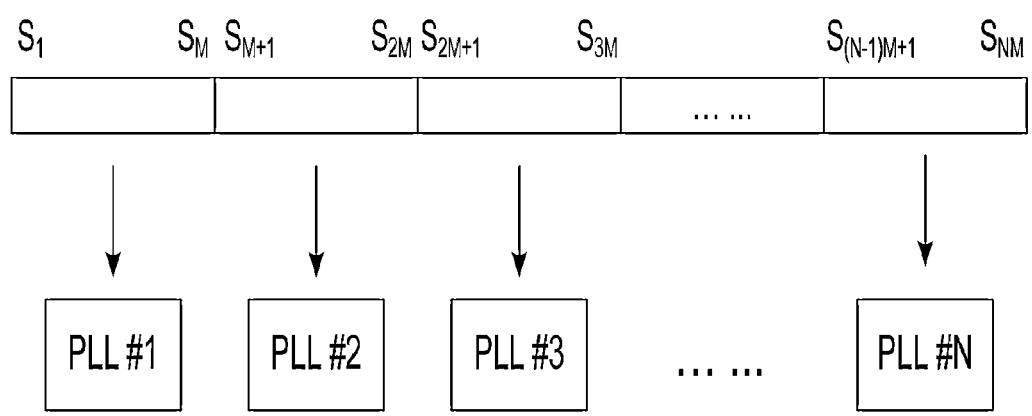
FIG. 1A shows one embodiment that divides a continuous data stream (e.g., continuous Analog-to-Digital-Convertor output samples) into segments of length M.

Embodiments of the present invention provide a solution for allowing parallel PLL processing. FIG. 1A shows one embodiment that divides a continuous data stream (e.g., continuous Analog-to-Digital-Convertor output samples) into segments of length M. During operation, each segment is processed by one PLL module. The system includes N PLL modules (PLL #1, PLL #2, PLL #3 . . . PLL #N) working in parallel for a higher throughput. With N modules, N segments can be processed simultaneously. After processing a first batch of N segments, subsequent batch of N segments are sent to the corresponding N PLL modules. Such a process repeats for incoming data stream.

Figure 1B:
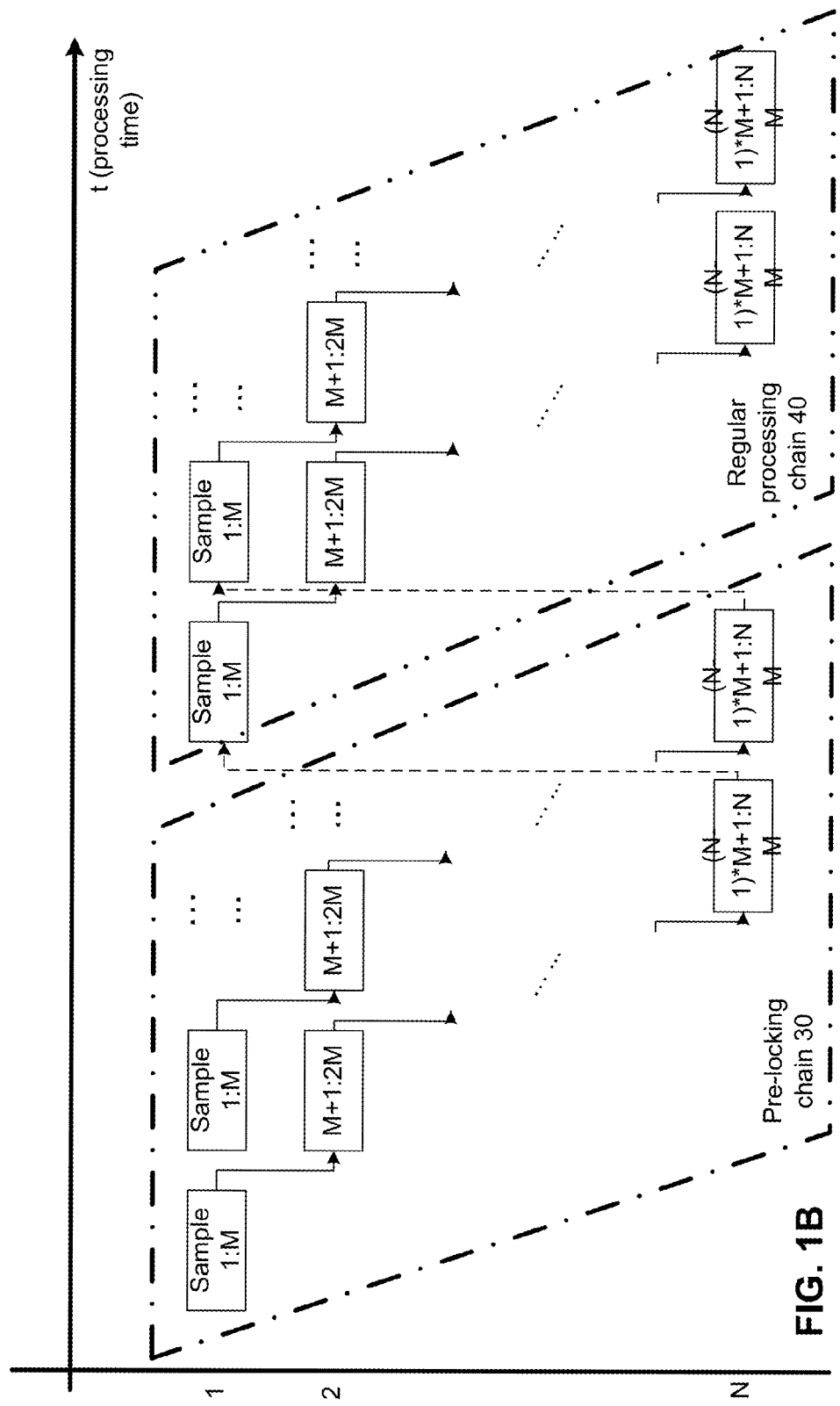
FIG. 1B shows one embodiment of FIG. 1A that uses two PLL chains—a pre-locking chain and a regular processing chain.

To enable parallel processing, an embodiment of the present invention shown in FIG. 1B uses two PLL chains; one is called pre-locking chain 30 and a regular processing chain 40. Each PLL chain includes N PLL modules, and each PLL module processes one segment at a time. The pre-locking chain 30 or processing path starts from a PLL model with a "free run" state, which can be obtained by initializing internal variables of the first PLL module with pre-defined values, such as zeros, or a long-term averaging value from PLL operation. Each of the remaining PLL modules within the chain is initialized with output from the previous module. Samples processed by the pre-locking chain belong to the same batch of N segments. The output from the last PLL module in this chain is used as initial value for the regular processing chain.

In the regular processing chain 40, based on initial values and input samples, PLL modules in this chain keeps tracking of the samples phase and frequency offset information, compensates the phase and frequency offset, and generates compensated outputs. The first PLL module in this chain is initialized using the output from pre-locking chain, which is generated from the previous N segments. Each remaining module uses the output from its previous PLL, with the samples belong to the same N segments.

Figure 2A:
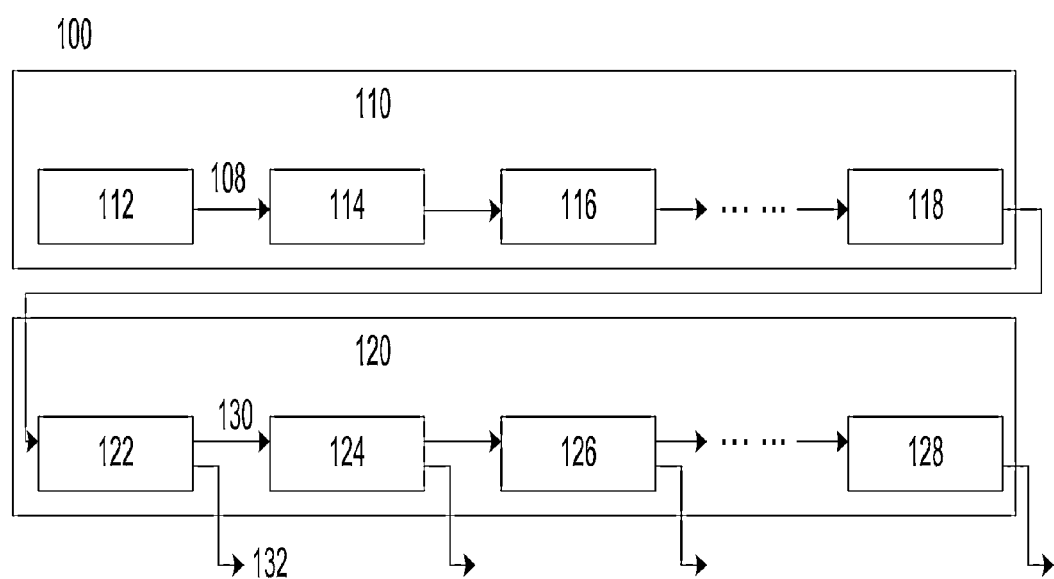
FIG. 2A shows a high-level diagram and coupling of PLL modules for another embodiment.

FIG. 2A shows a high-level diagram and coupling of PLL modules for another embodiment of the present invention. This embodiment includes two chains: pre-locking chain 110 for PLL pre-locking from a free-run state to locked state, and regular processing chain 120 for generating phase-compensated output. Each PLL module in pre-locking chain, such as modules 112, 114, 116, and 118 has its output connected to the next PLL module in the chain, except of the last PLL 118. For example, output 108 from PLL 102 is connected to PLL 114. Output of last PLL module 118 is connected to the input of the first PLL module 122 which belongs to regular processing chain 120. The head of pre-locking chain is always initialized using pre-defined values or values based on internal PLL processing, such as frequency offset which will be given later. The output of each pre-locking PLL module, such as output 108, includes necessary internal parameters, which will be explained in details later. Each PLL in regular processing chain 120 has two outputs: one can be used for internal parameter exchange, and the other one can be used for outputting compensation result. The internal-parameter-exchange output is connected to the input for the next PLL in order to keep the next PLL in locked state. For example, PLL 122 includes output 130, which is coupled to PLL 124, and output 132. The internal parameter output of last PLL 128 in regular processing chain is ignored.

Figure 2B:
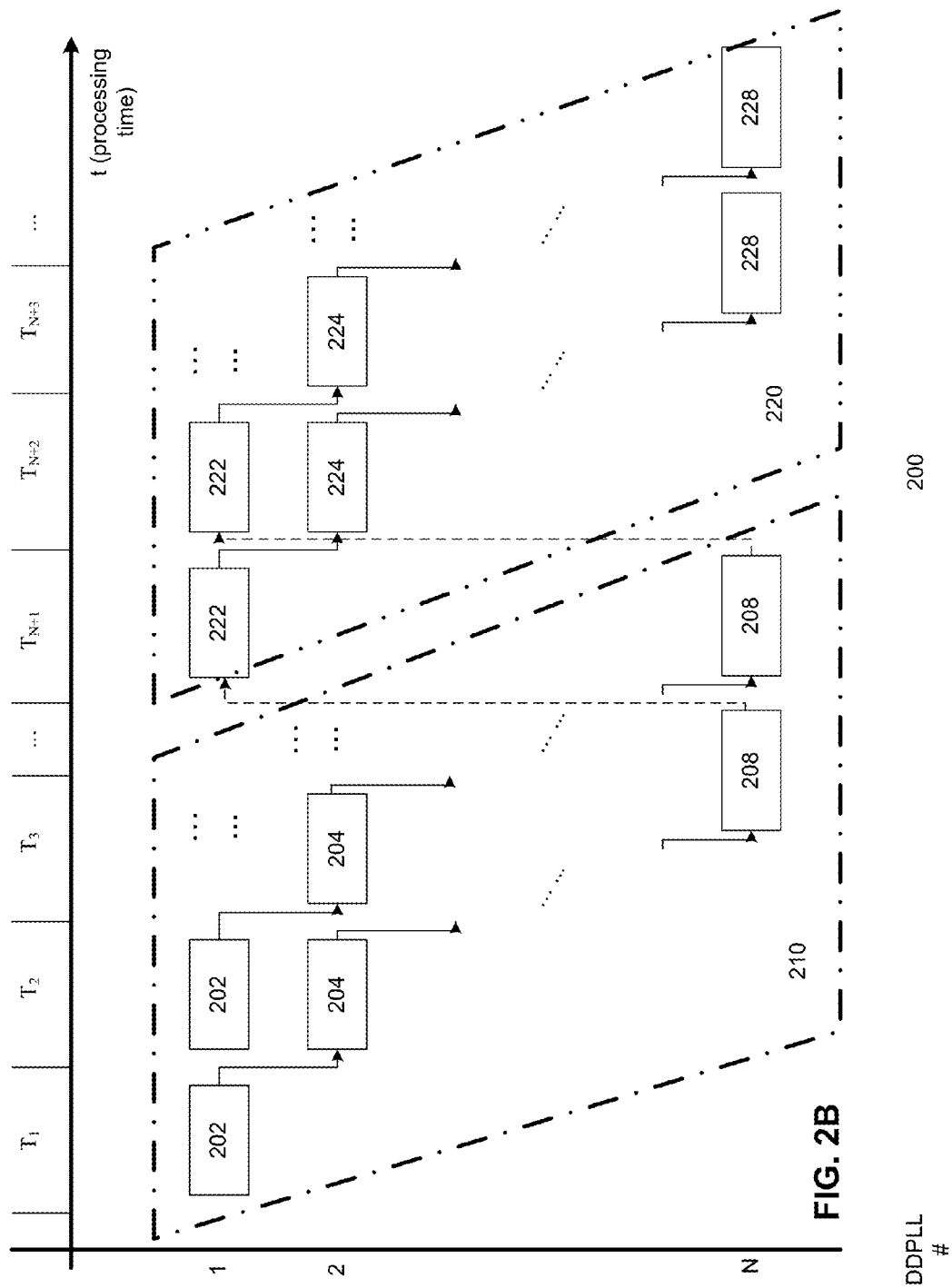
FIG. 2B shows an exemplary processing procedure and the coupling between the two chains.

FIG. 2B shows an exemplary processing procedure and the coupling between the two chains 210 and 220. After resetting the system, PLL 202 in pre-locking chain 210 is initialized with pre-defined or random values and processes input samples 1 to M one-by-one. After processing sample M, the internal state of PLL 202 is output to PLL 204 as initial values for PLL 204. Subsequently, PLL 204 starts the processing of samples M+1 to 2M, and outputs its internal states to a following PLL once sample 2M is processed. The chain continues moving forward until the last PLL 208 is reached. Altogether, chain 210 finishes the processing of a sample block with N*M samples since there are N PLL modules in pre-locking chain 210 and each module is configured to process a segment with sample length M. After passing the internal states to a following PLL, a respective PLL starts to process incoming data from subsequent sample block. For example, after processing samples 1 to M and outputting internal states to PLL 204, PLL 202 can start to process samples N*M+1 to N*M+M immediately, hence starting the processing of the second sample block in chain 210. Note that the processing of the first sample block (the first N*M samples) and the second block (the second N*M samples) by PLL chain 210 overlaps in time except for the first and last segment in FIG. 2B.

Regular processing chain 220 has same number of PLL modules, and each module configured to process a segment of length M. The first PLL in regular processing chain 220 (PLL 222) can start processing the beginning segment of the second block after receiving the output from the end of pre-locking chain 210, namely from PLL 208. Note that the internal state of PLL 222 is initialized using parameters outputted from PLL 208. Similar to the process in chain 210, the initial states of each following PLL module is set by the output of its previous PLL module. For example, after PLL 222 finishing the processing of the first segment (samples N*M+1 to (N+1)*M), its internal state is passed to PLL 224, and then PLL 224 can process a following segment and so on. The rest of the operation of regular processing chain 220 is similar to that of pre-processing chain 210, as shown in FIG. 2B.

Figure 3:
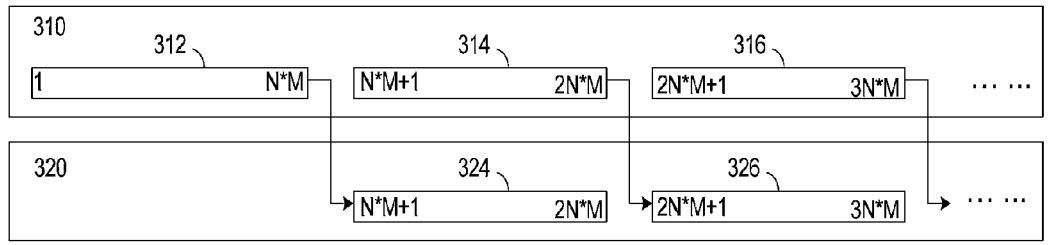
FIG. 3 is a logical illustration of pre-locking and regular processing, with same processing length in both chains.

The aforementioned procedure assumes same number PLL modules and samples processed in the two chains, which is logically shown in FIG. 3. FIG. 3 is a logical illustration of pre-locking and regular processing, with same processing length in both chains. Both pre-locking chain 310 and regular processing chain 320 processes samples in blocks of size N*M. For example, blocks 312, 314, 316, which are processed by pre-processing chain 310, and blocks 324 and 326, which are processed by regular processing chain 320, are all of the same length. In another embodiment, the number of samples processed in the pre-locking chain can be less than that in the regular processing chain. For example, the head of the pre-processing chain can start processing from the K-th sample within a block of size N*M, where 1<K<N*M. Once the head of pre-processing chain finishes a first segment, it starts processing the second block from sample number N*M+K.

Figure 4:
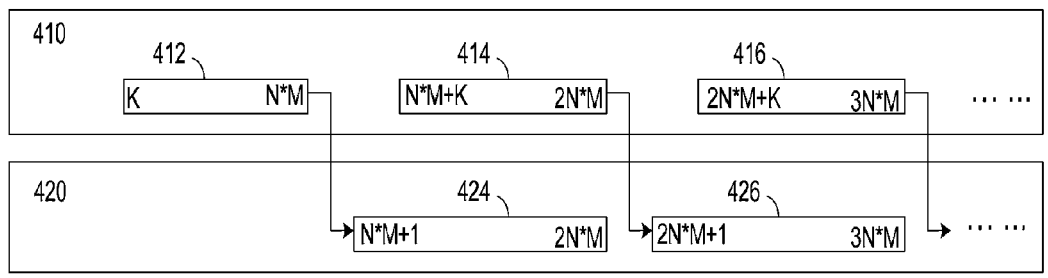
FIG. 4 shows a logical illustration of pre-locking and regular processing, with different length in the two chains.

FIG. 4 shows a logical illustration of pre-locking and regular processing, with different length in the two chains. As shown in FIG. 4, in pre-locking chain 410, blocks 412, 414, and 416 have length N*M−K+1, while in regular processing chain 420, blocks 424, 426 have length N*M.

Figure 5:
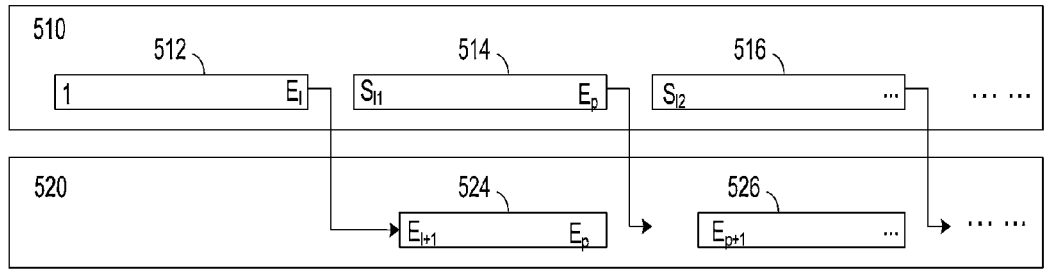
FIG. 5 shows a logical illustration of pre-locking and regular processing, with different length in the two chains.

FIG. 5 shows a logical illustration of pre-locking and regular processing, with different length in the two chains. In this embodiment, the number of samples processed in pre-locking chain 210 is more than that in regular processing chain 220. For example, after reset, PLL 202 can start the processing chain from sample 1, and pre-locking chain 210, in particular PLL 208, ends at sample E, while regular processing chain's first PLL 222 starts from sample $E_l$+1, and the whole chain 220 ends at $E_p$, where $E_p - E_l < E_l$. Then PLL 202 starts processing from sample $S_{l1}$, where $S_{l1} = E_p + 1 - E_l$, and ends at $E_p$. This case is logically shown in FIG. 5, where in pre-locking chain 510, processing 512, 514 and 516 have length $E_l$, while in regular processing chain 520, processing 524 and 526 have length $E_p - E_l$.

The examples of FIGS. 3-5 are for logical illustration only, and do not represent the actual timing which in fact is parallel. In the embodiments mentioned above, every two adjacent PLL modules, such as PLL 202 to PLL 204, and between the last one in pre-locking chain 210 and the first one in regular processing chain 220, processes continuous samples. Thus, if the last sample in segment S processed in PLL 202 is i, the first one input to PL 204 will be i+1. In another embodiment, adjacent PLL modules can have non-continuous samples input.

Figure 6:
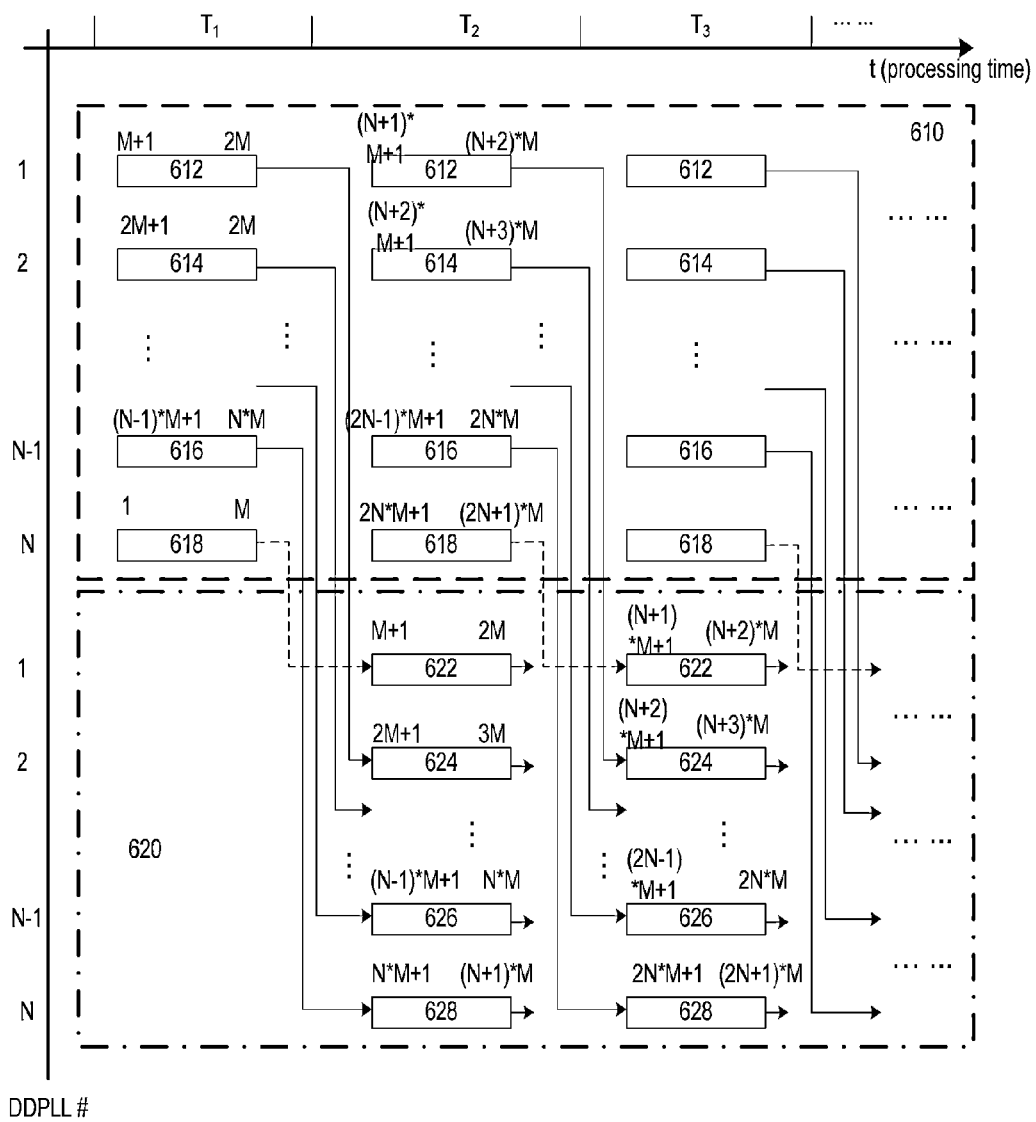
FIG. 6 shows an exemplary embodiment with one pre-locking PLL module only in pre-locking chain.

FIG. 6 shows an exemplary embodiment with one pre-locking PLL module only in pre-locking chain. In case the PLL module can be locked from "free run" state to locked state within one segment processing, the single pre-locking chain and regular processing chain can be break into multiple chains to save buffer size and reduce the processing latency. In FIG. 6, 610 is pre-locking chain, in which each chain contains a single PLL module, like PLL 612, PLL 614, PLL 616, and PLL 618. For the first N segments (time period $T_1$), PLL 612 deals with sample M+1 to 2*M, while for the second N segments (time period $T_2$), PLL 612 processes sample (N+1)*M+1 to (N+2)*M. The samples processed by other PLL modules at different time are also given on the top of each block. The internal PLL parameter outputs are passed to PLLs in regular processing chain 620, in that PLL 622 receives parameters from PLL 618, and in time period $T_2$, it processes samples M+1 to 2M; PLL 624 receives parameters from PLL 612, and in time period $T_2$, it processes samples 2M+1 to 3M; and so on. Similar procedure can be used in other cases when the PLL can be locked within two or more segments processing.

The above mentioned embodiments use initially free-run pre-locking chain to have the PLL locked and then pass the locked parameters to regular processing chain. This may result in initial phase uncertainty. For example, the actual phase for the first sample input to the regular processing chain should be π, but due to lacking of initial state, with the embodiments mentioned above, it may result in π/2, and there will be −π/2 phase shifting for all subsequent signals in the regular processing chain. One embodiment to solve this problem is to have training phase, for example, we may set the transmitter side for the start of each N segments to be fixed phase 0; then if the output for the first signal is π/2, all the compensated signals in that chain should be rotated −π/2. In another embodiment, transmitter side may use differential phase encoding, and at the receiver side, only phase distance between two adjacent signals is of interest. For example, if the phase difference of signal i to i−1 is π/2, then for signal i, its actual phase is π/2. In this case the initial phase uncertainty will not have impact to the decoded output.

Figure 7:
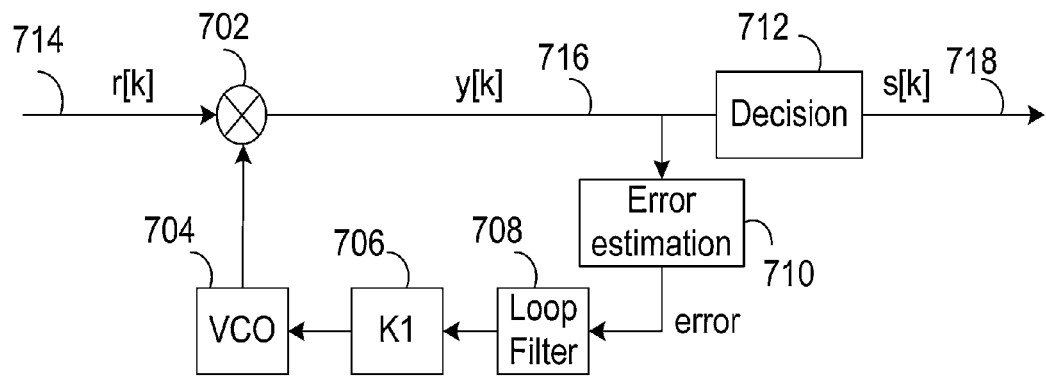
FIG. 7 shows an exemplary block diagram of a Decision-Directed PLL (DDPLL).

An exemplary implementation of the PLL mentioned above is Decision-Directed PLL (DDPLL), with block diagram given in FIG. 7. Input signal 714 is first compensated by current VCO 704 output, by complex multiplier 702 which actually acts as phase rotator. The compensated output signal 716 is fed into two branches: one through phase decision block 712 to get output signal 718; the other one passes through error estimation block 710 to calculate instant phase error. A loop-filter 708 is applied to instant error to remove noise, and coefficient K1 in 706 is applied to filtered phase error, to update VCO 704. In one embodiment, the loop filter 708 is IIR filter represented with the following equation:

$$lf(z) = \frac{1 + \frac{1}{K_z} - z^{-1}}{1 - z^{-1}}.$$

In another embodiment, the error is adjusted with a sine function. The following gives the pseudo code for the block diagram in FIG. 7 except for the decision module, assuming M-PSK (Phase Shift Keying) modulation:

$y(i)=r(i)*\exp(-j*VCO(i-1));$ $error(i)=\sin(\text{angle}(y(i)^\wedge M/M);$ $lf(i)=lf(i-1)+error(i)*K1/K2;$ $VCO(i)=VCO(i-1)+lf(i)+K1*error(i).$ lf(i) is averaged frequency offset.

Figure 8:
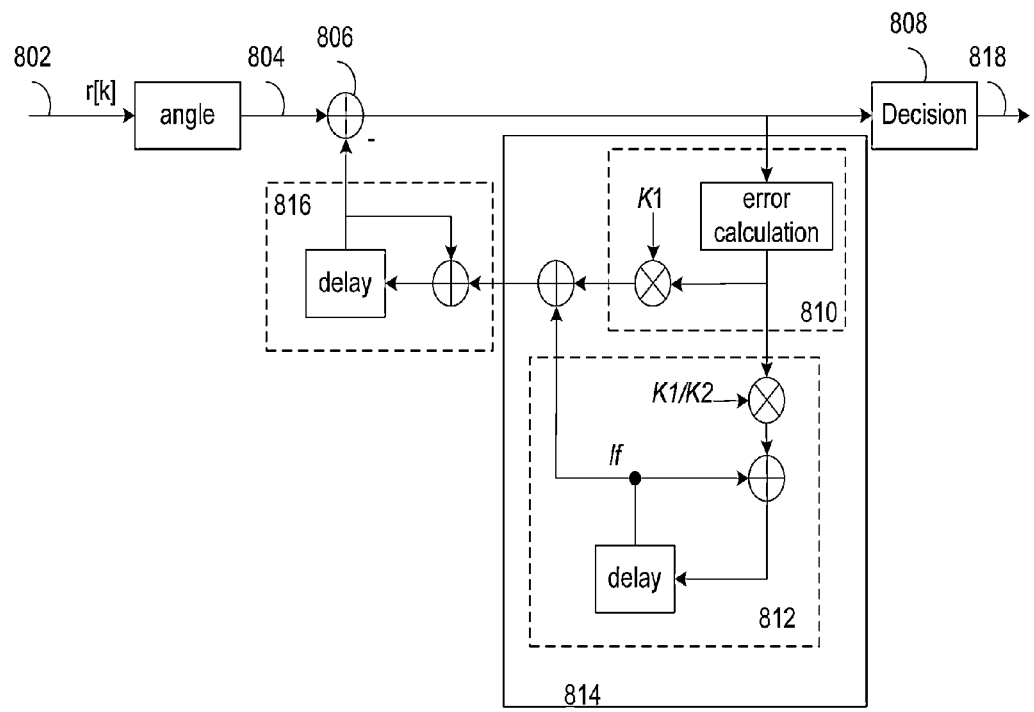
FIG. 8 shows an exemplary DDPLL hardware implementation.

FIG. 8 shows an exemplary DDPLL hardware implementation. In this embodiment, the parameters to be passed from one PLL module to the next include (but not limited to) VCO 816's outputs for the last R1 cycles of processing, and low pass 812's outputs for the last R2 cycles of processing. Here R1 and R2 are determined by the delay from the clock cycle feeding input to the circuit until the clock cycle that VCO and lf are affected by this sample respectively. In one embodiment, the parameters to be passed from one PLL module to the next include output from all the delay blocks within the loop, and the number of cycles is determined by the latency from one signal input to the output which is affected by the giving input. In a further embodiment, if differential encoding and decoding are used in the transmitter and receiver's phase decision block, the passed parameters also include the decoded phase of the last signal in the previous PLL block, so that the actual phase can be gotten by subtracting the phase of last signal from the current one. For signals belong to different segment batch, last VCO value of segment batch i−1 and first VCO value of segment batch i might also be needed for this differential decoding.

Figure 9:
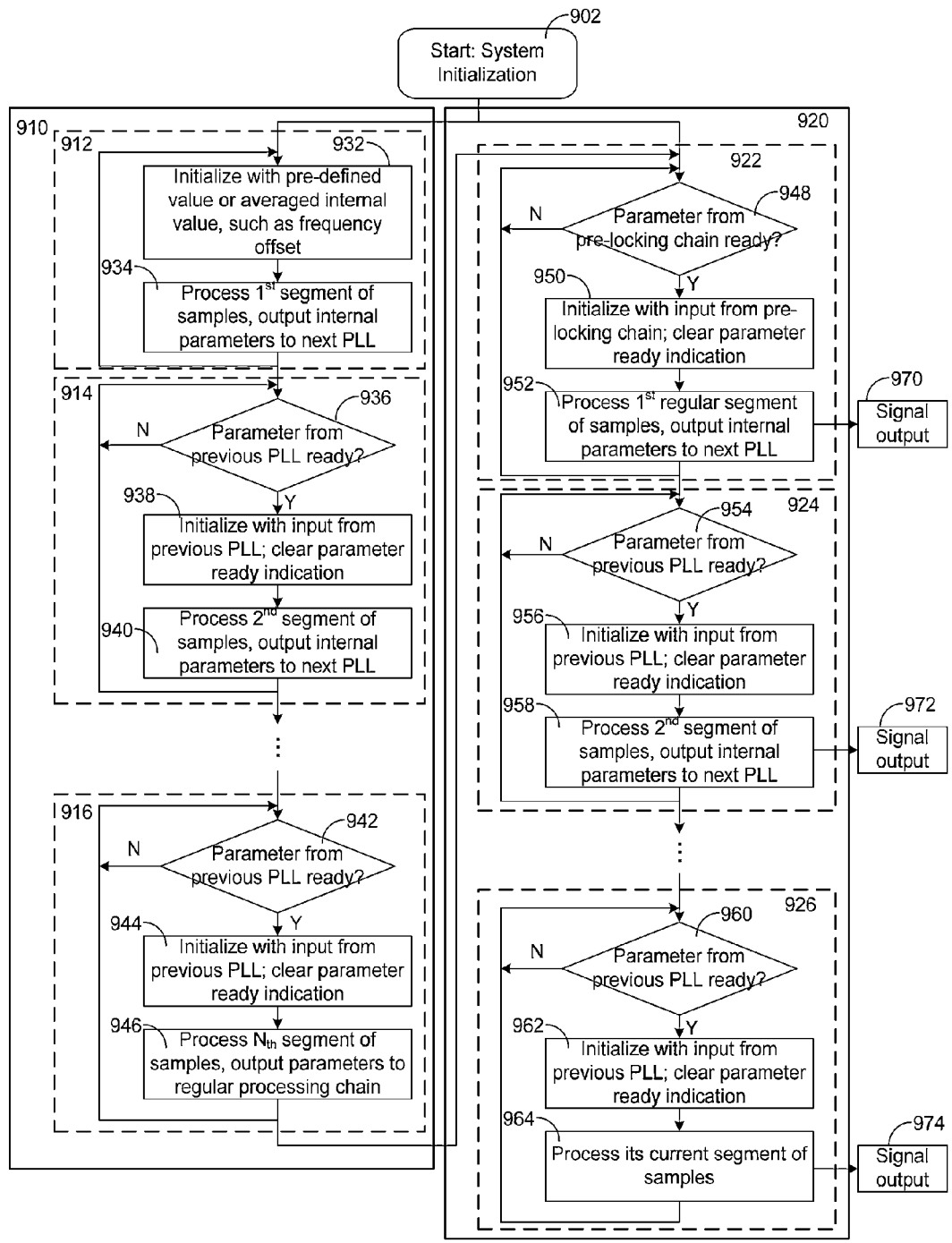
FIG. 9 shows an exemplary flow chart for the processing operations in pre-locking chain and regular processing chain.

FIG. 9 shows an exemplary flow chart for the processing operations in pre-locking chain and regular processing chain, to explain the aforementioned embodiments. After system initialization 902, pre-locking chain 910 starts operating from PLL 912, which is first initialized with pre-defined value as in step 932, then processes the first segment in the first block as step 934, and then outputs the internal states to next PLL 914 as initial value. PLL 912 then goes back to process the first segment in a second block, and so on. For PLL 914, it waits until parameters from PLL 912 are ready (step 936), initializes the internal states with parameters from PLL 912 (step 938), and then processes the 2nd segment in the first block. The outputs from PLL 914 are also internal parameters to its next PLL in the chain, to be used as initial value. Then PLL 914 waits to process the respective segment in the next block. All subsequent PLLs in 910 have similar function, until the chain reaches the last one PLL 916. Outputs from 916 are passed to regular processing chain 920 as initial value. PLLs 922, 924, and 926 have similar procedure as those in pre-locking chain 910, except that each PLL also have compensated outputs, such as output 970, 972, and 974.

The invention may be implemented in hardware, firmware or software, or a combination of the three. Preferably the invention is implemented in a computer program executed on a programmable computer having a processor, a data storage system, volatile and non-volatile memory and/or storage elements, at least one input device and at least one output device.

By way of example, a computer with digital signal processing capability to support the system is discussed next. The computer preferably includes a processor, random access memory (RAM), a program memory (preferably a writable read-only memory (ROM) such as a flash ROM) and an input/output (I/O) controller coupled by a CPU bus. The computer may optionally include a hard drive controller which is coupled to a hard disk and CPU bus. Hard disk may be used for storing application programs, such as the present invention, and data. Alternatively, application programs may be stored in RAM or ROM. I/O controller is coupled by means of an I/O bus to an I/O interface. I/O interface receives and transmits data in analog or digital form over communication links such as a serial link, local area network, wireless link, and parallel link. Optionally, a display, a keyboard and a pointing device (mouse) may also be connected to I/O bus. Alternatively, separate connections (separate buses) may be used for I/O interface, display, keyboard and pointing device. Programmable processing system may be preprogrammed or it may be programmed (and reprogrammed) by downloading a program from another source (e.g., a floppy disk, CD-ROM, or another computer).

Each computer program is tangibly stored in a machine-readable storage media or device (e.g., program memory or magnetic disk) readable by a general or special purpose programmable computer, for configuring and controlling operation of a computer when the storage media or device is read by the computer to perform the procedures described herein. The inventive system may also be considered to be embodied in a computer-readable storage medium, configured with a computer program, where the storage medium so configured causes a computer to operate in a specific and predefined manner to perform the functions described herein.

The invention has been described herein in considerable detail in order to comply with the patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed is:

1. A parallel phase locked loop (PLL) system, comprising:
a first chain of a plurality of pre-locking PLLs that operates from a free-run state to a locked state; and
a second chain of a plurality of PLLs to work from the locked-state to recover signal output,
wherein the PLL comprises a decision directed PLL (DDPLL) comprising an internal state with a frequency offset, the internal state comprises a voltage controlled oscillator (VCO) output for a phase rotation, and the VCO compensates a phase output using a subtractor, wherein the subtractor output is coupled to a decision block and an error calculation block to determine an error, wherein the error is processed by a low-pass-filter to get a frequency offset, and the frequency offset together with adjusted error are added as a VCO updating value.

2. The system of claim 1, wherein the first and second chains each contain multiple PLLs.

3. The system of claim 2, wherein each PLL inside one chain passes internal states to a subsequent PLL after processing of one segment.

4. The system of claim 2, wherein each of the first and second chains has matching number of PLLs.

5. The system of claim 1, wherein the first chain has more PLLs than the second chain.

6. The system of claim 1, wherein the first chain has fewer PLLs than the second chain.

7. The system of claim 1, wherein the PLLs operate in parallel, wherein after processing of one segment in a particular block, each PLL immediately processes another segment in a subsequent next block.

8. The system of claim 1, wherein the first and second chains process different number of samples in one block.

9. The system of claim 1, wherein the first and second chains process matching number of samples in one block.

10. The system of claim 1, wherein the first chain has a frequency offset initialized to a previous processing value.

11. The system of claim 1, wherein the internal state of one DDPLL is passed to a subsequent DDPLL.

12. The system of claim 1, wherein the first chain is initialized to a predetermined value.

* * * * *